United States Patent [19]

Breithaupt

[11] Patent Number: 5,013,869

[45] Date of Patent: May 7, 1991

[54] HIGH-FREQUENCY-IMPERVIOUS SHIELDING DOOR

[75] Inventor: Albert Breithaupt, Uersfeld/Bhf, Fed. Rep. of Germany

[73] Assignee: Trube & Kings KG, Fed. Rep. of Germany

[21] Appl. No.: 293,947

[22] Filed: Jan. 5, 1989

[30] Foreign Application Priority Data

Jan. 8, 1988 [DE] Fed. Rep. of Germany ... 8800132[U]

[51] Int. Cl.⁵ ............ H05K 9/00
[52] U.S. Cl. ............ 174/35 MS
[58] Field of Search ............ 174/35 MS

[56] References Cited

U.S. PATENT DOCUMENTS

| | | | |
|---|---|---|---|
| 3,518,355 | 6/1970 | Luce | 174/35 MS |
| 3,531,577 | 9/1970 | Garlington | 174/35 MS |
| 3,589,070 | 6/1971 | Hansen | 174/35 MS X |
| 4,750,569 | 6/1988 | Flogaus | 174/35 MS |
| 4,794,206 | 12/1988 | Weinstein | 174/35 MS |

*Primary Examiner*—Leo P. Picard
*Assistant Examiner*—David A. Tone
*Attorney, Agent, or Firm*—Jones, Askew & Lunsford

[57] ABSTRACT

A shielding door for an electromagnetically shielded room. The door has a door panel which is hingedly mounted. Attached to the door panel is a sheet-metal shroud which is movable between a closed-door position remote from the panel and an open-door position near the panel.

18 Claims, 7 Drawing Sheets

HIGH-FREQUENCY-IMPERVIOUS SHIELDING DOOR

Figure 2:
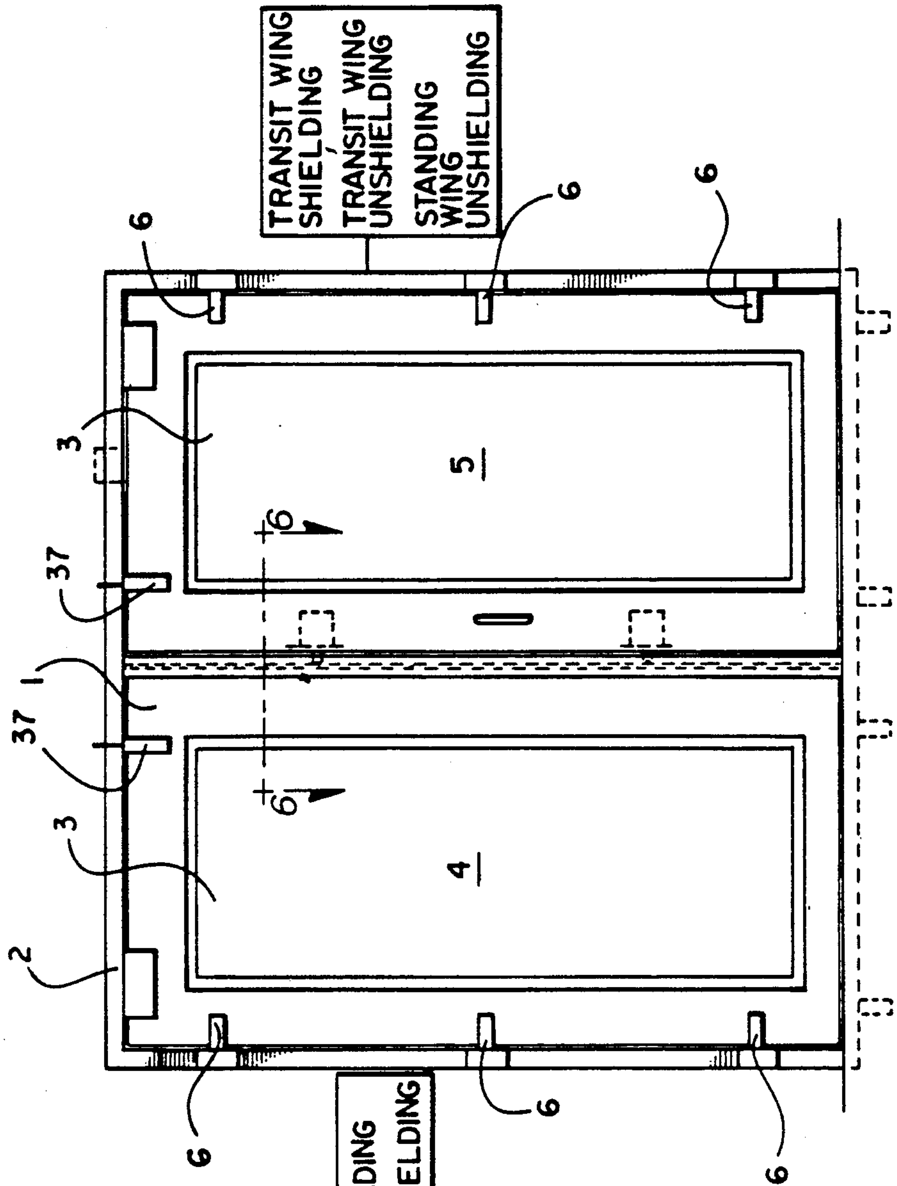

The present invention pertains to a high-frequency (HF) impervious shielding door, consisting of at least one shrouded door panel and a door frame, on which the door panel is hinged, as well as a contact arrangement for establishing an electrical connection, when the door is closed, between the shroud and a room shield terminating at the door frame.

With a known shielding door of this type, the contact arrangement takes the form of a four-sided blade seal in the fissure area between the door frame and the door panel. However, with this known construction, it has been shown that the spring contacts of the blade seal are subject to damage. During the pivoting movement of the door panel, friction develops between the engaging and disengaging blade and the fixed contact springs because the midline of the door hinge plate does not lie in the same plane as that of the tip of the contact blade. In its pivoting movement the blade tip must first travel a greater distance with constant radius until the tip of the blade and the midpoint of the hinge plate align in a common plane, i.e., both parallel to the door frame.

Proceeding from the known shielding door, the fundamental task of the invention is to improve said door so that the shielding effect thus provided can be fully retained over a long period of use, in that a dependable and nearly frictionless contact arrangement is provided.

This is accomplished, in keeping with the invention, in that the sheet-metal shroud paralleling the plane of the door panel is fixed displaceably between two end positions, while the end position remote from the door panel is the closed position of the contact arrangement, and the end position near the door panel is the open position of the contact arrangement. Therefore, the invention is based on the fundamental concept of a contact arrangement, which opens or closes independently of the pivoting movement of the door, so that an exclusively linear movement of the contact elements constituting the contact arrangement results. In keeping with the invention, it is then possible to maneuver the contact elements independently of the movement of the door panel itself, so that the contact arrangement can then be activated with the door in a position in which an exact alignment of the contact elements occurs at the completion of a pivoting movement of the door, i.e., in the closed state of the door panel. The result is extensive freedom from wear for the contact arrangement. Furthermore, the shielding effect of the door can be realized independently of the closed position of the door, i.e., there is no forced shielding effect when the door is closed. Consequently, the shielding door of the invention can also be used as a normal room closure. This also results in appreciable extension of the useful life of the shielding door of the invention in the area of its contact elements.

Figure 1:
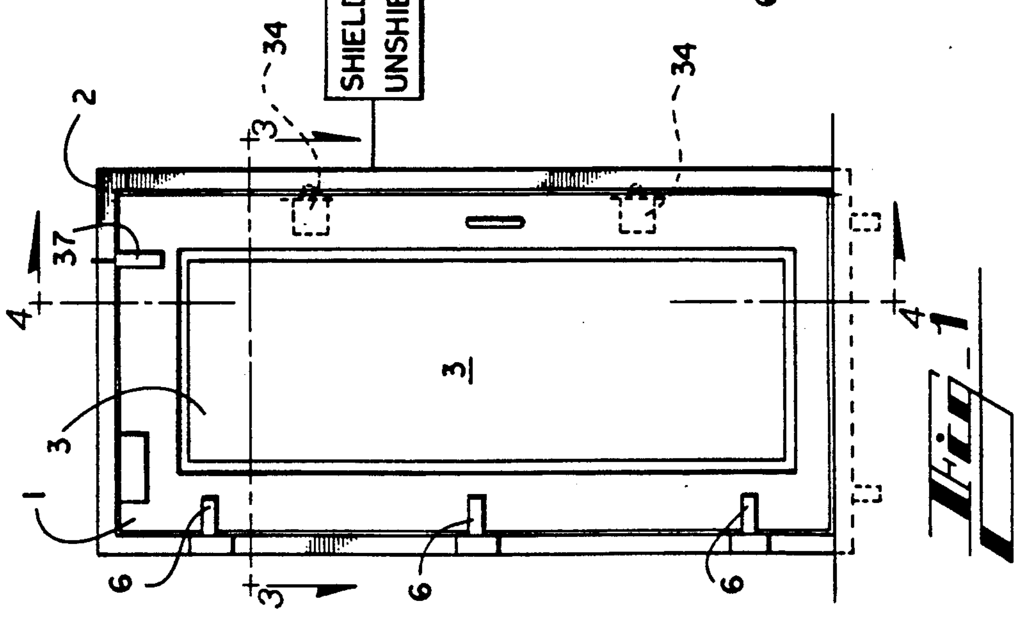

The invention is described in greater detail below with references to the appended drawings of embodiment examples. The drawings show:

FIG. 1, a view of a single shielding door according to the invention.

FIG. 2, a view of a double shielding door according to the invention.

Figure 3:
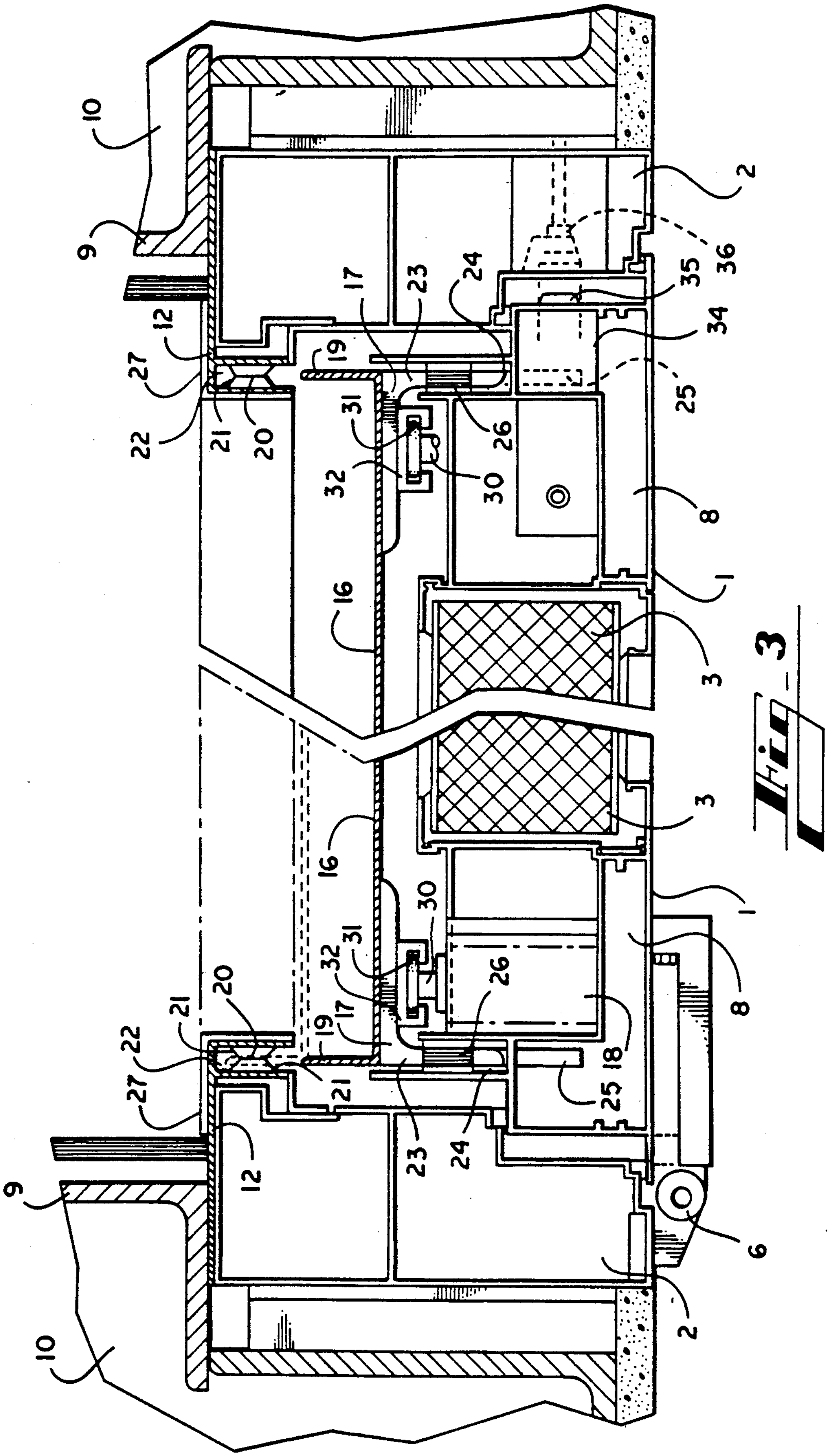

FIG. 3, a cross section along line 3—3 in FIG. 1.

Figure 4:
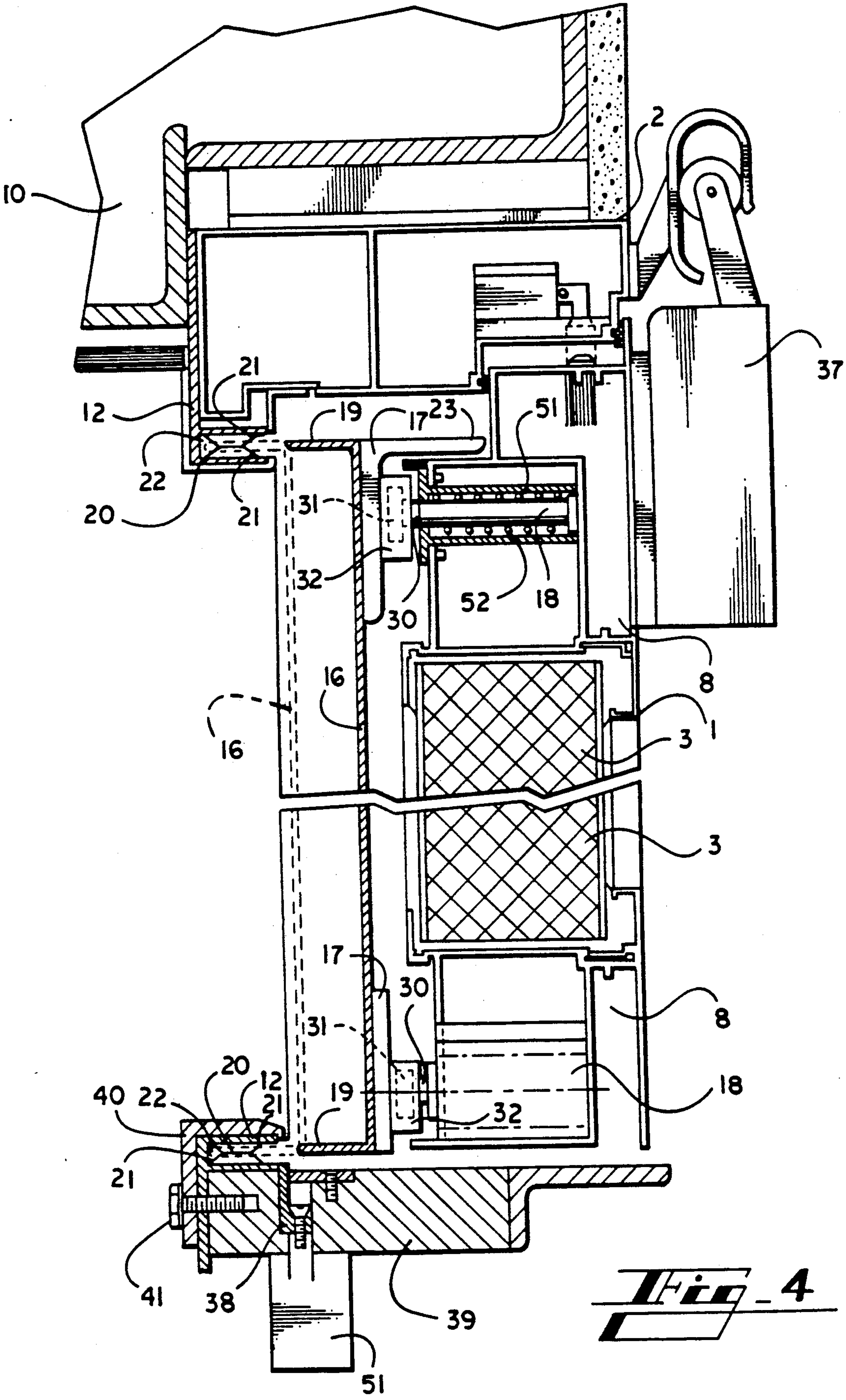

FIG. 4, a cross section along line 4—4 in FIG. 1.

Figure 5:
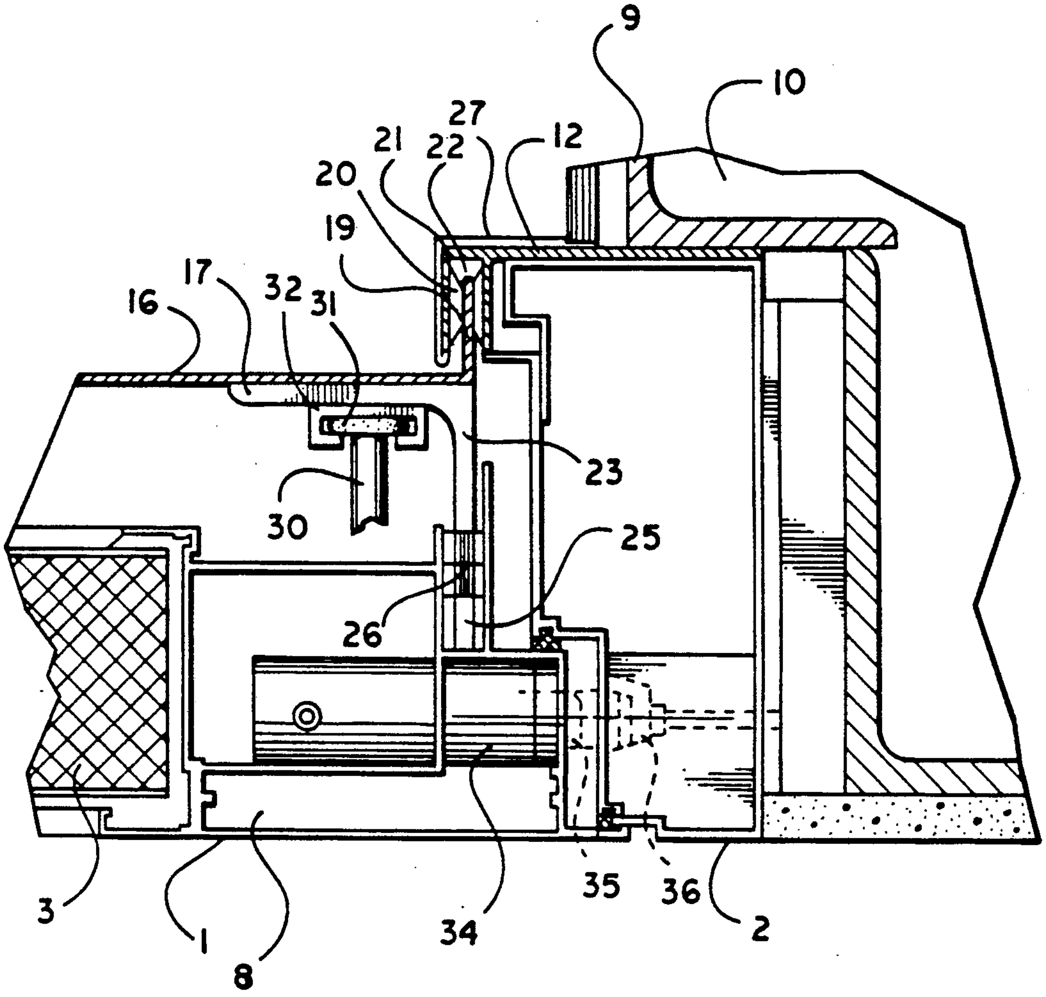

FIG. 5, a partial section in keeping with FIG. 3 with closed contact arrangement.

Figure 6:
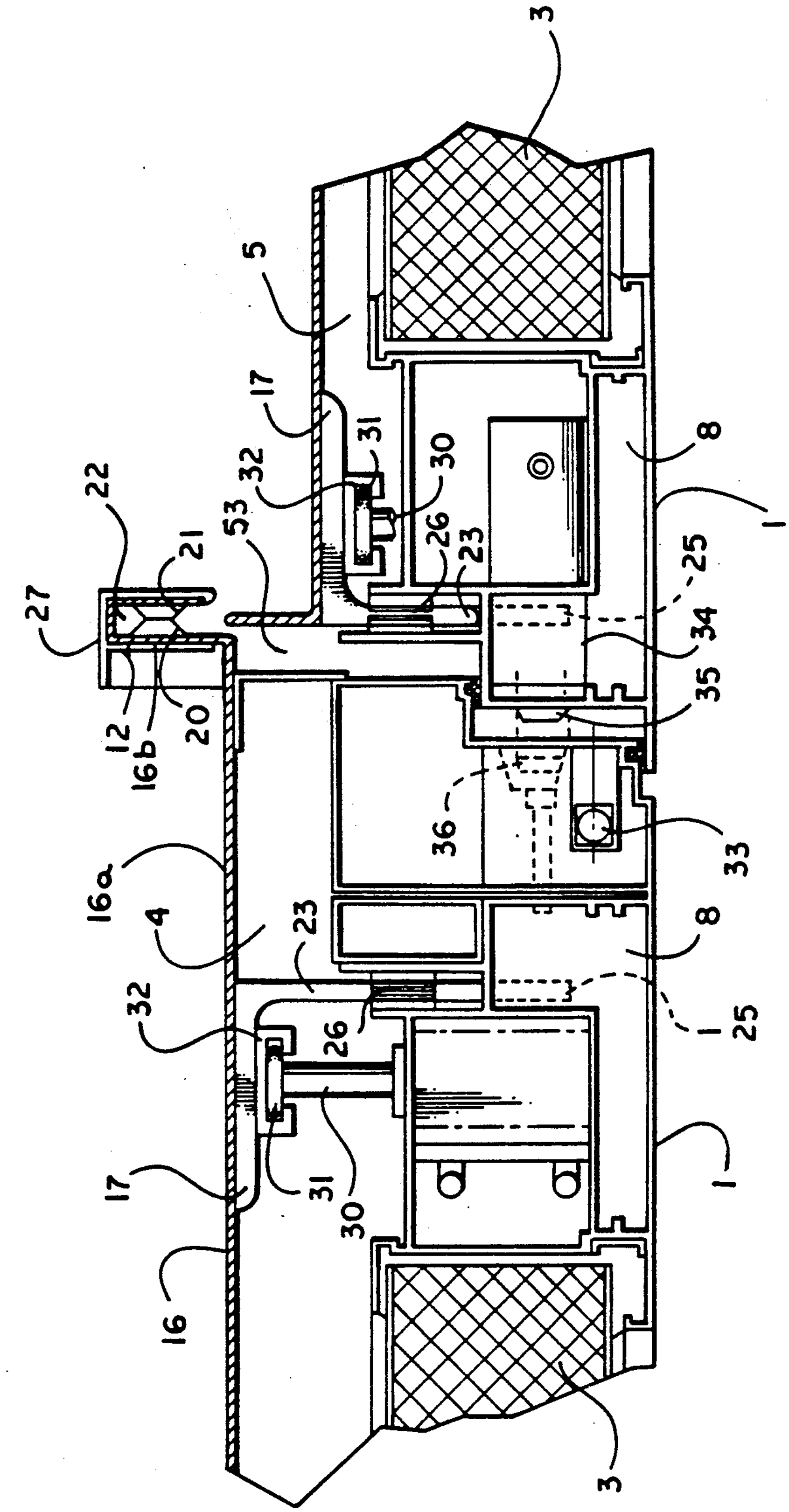

FIG. 6, a cross section along line 6—6 in FIG. 2.

Figure 7:
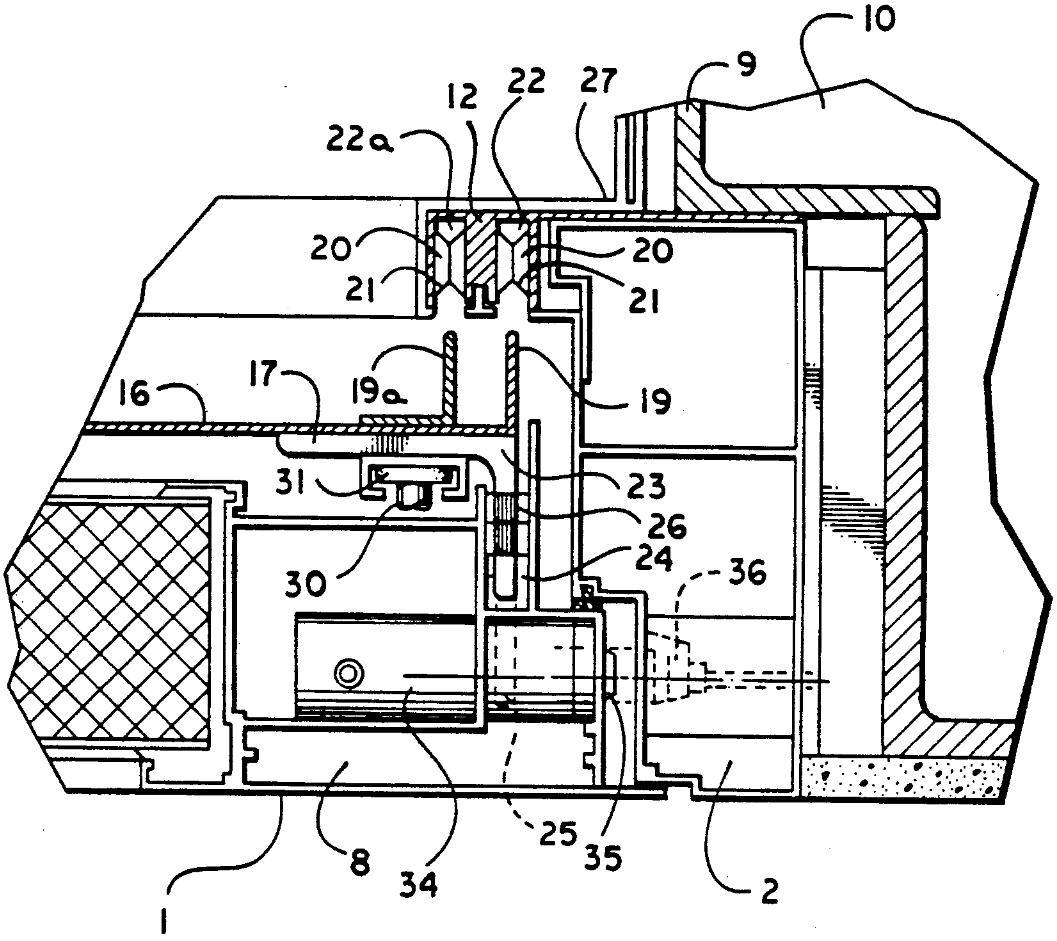

FIG. 7, a partial view of a shielding door according to the invention as depicted in FIG. 3, but with a modified contact arrangement.

Figure 8:
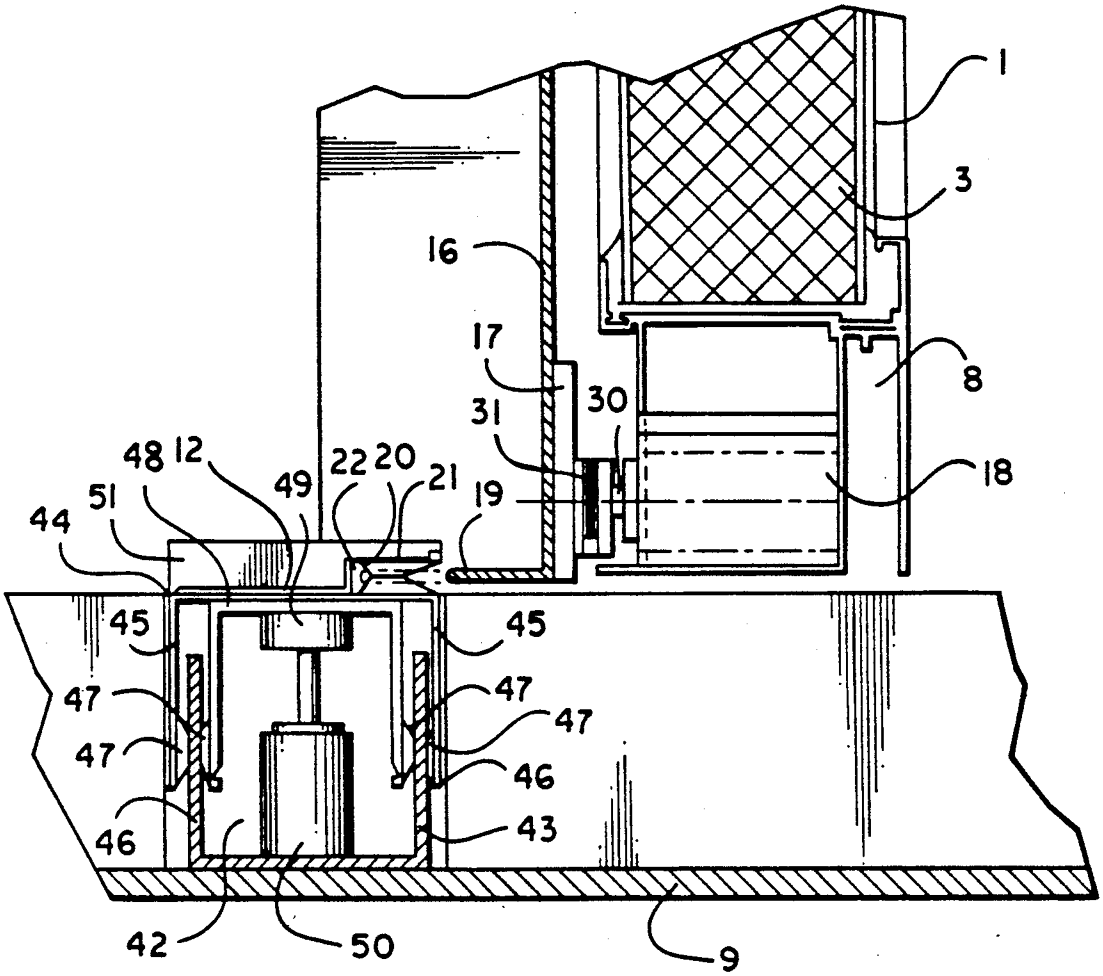

FIG. 8, a partial view of the lower part of the shielding door in keeping with the invention as depicted in FIG. 4, with a lowerable threshold base also in keeping with the invention.

As shown in FIG. 1, an HF-impervious shielding door in keeping with the invention consists of door panel (1) and door frame (2). Both door panel (1) and door frame (2) are preferably made of steel or a lightweight metal, while door panel (1) contains filling (3) that can insulate sound, warmth, and/or heat.

Shown in FIG. 2 is a shielding door in keeping with the invention, which, unlike the door in FIG. 1, has a double door panel. This double door panel consists of standing wing (4) and transit wing (5).

The shielding doors of the invention are used for shielding a room with installed room shield (9). As a rule, the shielding of such rooms consists of sheet steel at least 4 mm thick, which is completely welded at all seams. The openings of the room are then sealed by means of HF-impervious shielding doors. The damping requirements of such shielding doors are the same as those for the room shield. For example, the following shield damping requirements apply:

Electrical field: 100 dB from 10 kHz to 10 GHz

Magnetic field: 40 dB at 10 kHz, increasing to >70 dB at 100 kHz, increasing to >100 dB at 1 MHz-100 GHz As may be clearly seen in the appended figures, a shielding door according to the invention is fitted into an opening in wall (10) of room (7). Between door frame (2) and wall (10), there is room shield (9). Between the metallic profile of the door frame and room shield (9), there is guide profile (12) of copper, brass, bronze, or steel, by means of which an electrically conductive connection is established between the door frame on the one side and the room shield on the other. Door panel (1) is pivotably mounted on door frame (2) by means of several adjustable door hinges (6). The doorstop is so arranged that the door panel is opened from the interior of room (7) to the outside. Filling (3) of door panel (1) is retained by frame (8). The profile of frame (8) and the profile of door frame (2) are so designed in a known manner that a labyrinthine fissure is formed between them, which is sealed in a known manner by profiled sealing strips when the door of the invention is closed.

As may be further seen in FIGS. 3 and 4, the side of door panel (1) facing toward the interior of room (7) bears sheet-metal shroud (16). This shroud (16) is preferably made of copper, steel, or stainless steel. Sheet-metal shroud (16) is secured by angled holders (17), which are L-shaped in cross section. Angled holders (17) themselves are affixed to door panel (1) by piston-cylinder devices (18). Piston-cylinder devices (18) are preferably pneumatically or hydraulically activated contrivances. Sheet-metal shroud (16) has peripheral rim flange (19), which projects toward the interior of the room at right angles. On door frame (2) and opposite said rim flange (19) is contact arrangement (20), which works with rim flange (19). This contact arrangement (20) is in electrically conductive connection with guide profile (12) and is received by the latter. Contact arrangement (20) consists of several pairs of springs consisting of two opposing springs (21) enclosing a contact fissure. Springs (21) are arranged inside chamber (22) of guide profile (12), which is U-shaped in cross section and open toward rim flange (19). Springs (21), in conjunction with rim flange (19), form a so-called blade seal, in which rim flange (19) represents the "blade." Guide profile (12) with its chamber (22) protrudes into the opening outlined by door frame (2) to a sufficient extent to meet rim flange (19) of sheet-metal shield (16) covering door panel (1). In the illustrated embodiment example, rim flange (19) closes flushly with arm (23) of angled holder (17) directed toward door panel (1). Arm (23) fits into one-sided, open receiver (24) on frame (8). This fitting preferably consists of a support for the sheet-metal shroud welded to angled holder (17), which is mounted in ballbearing race (26) with a height-adjustable holding frame. Guide profile (12) and its chamber (22) are externally enclosed in a covering and safety profile (27).

Piston-cylinder device (18) has piston rod (30) with bearing plate (31) at its free end. Bearing plate (31) is grasped by guide piece (32) with play, so that a flexible anchoring results, by means of which door sag can be compensated. By activating piston-cylinder device (18), shroud (16) paralleling the plane of the door can be displaced between two end positions. In the one end position, which is the open position, shroud (16) is located near door panel (1) and blade (19) is out of contact with springs (21). In the other end position, the closed position, shroud (16) is remote from door panel (1) and blade (19) extends into the contact fissure formed by springs (21) to form a conductive connection via springs (21) and guide profile (12) between shroud (16) and room shield (9). This position is illustrated in FIG. 5 and indicated in broken outline in FIGS. 3 and 4. In this manner, the fissure between door (1) and door frame (2) is also shielded and the door becomes an integrated part of room shield (9). This arrangement and design of shroud (16) with the contact arrangement permits activation of the contact arrangement independently of the pivoting movement of door panel (1). Thus, a linear movement of blade (19) is ensured, so that uniform stress is applied to springs (21) and premature wear of the same is avoided. As may also be seen in FIGS. 1-4, two locking devices (34), e.g., are provided on the side opposite hinges (6). Each of these locking devices (34) preferably consists of a hydraulically or pneumatically activated security bolt (35), which fits into holes (36) in door frame (2). Furthermore, an auxiliary holding and closing device (37) of known design can be affixed to door panel (1) and door frame (2).

Also shown in FIG. 4 is an arrangement for shielding the floor-door fissure in an area between threshold base (39) and the door panel. Guide profile (12) is fastened to the face of threshold base (39) directed toward the interior of room (7), while chamber (22) of guide profile (12) above the top side of the threshold base is oriented toward rim flange (19) (blade). Guide profile (12) is joined with room shield (9). Guide profile (12) is also externally protected by covering profile (40), which is fixed to threshold base (39) by means of screws (41). Positioned in front of the opening of chamber (22) and secured in threshold base (39) is dirt-exclusion plate (38), which can be raised and lowered depending on the position of the sheet-metal shroud, i.e., depending on the closed or open position of the latter, the dirt-exclusion plate is lowered or raised to cover the opening of chamber (22).

An alternative design of the floor-fissure shielding is shown in FIG. 8. In this case there is no threshold base. In channel (42) in the floor of the room to be shielded, a U-shaped contact profile (43) running the entire length of the channel is in conductive connection with room shield (9). This U-shaped contact profile (43) is embraced from above by U-shaped covering profile (44). Both of vertical arms (45) of covering profile (44) are designed as receiver chambers, into which upright arms (46) of contact profile (43) fit. Several pairs of opposing contact springs (47) are arranged in the vertical arms of covering profile (44), between which upright arms (46) of the contact profile glide, so that an electrically conductive connection is formed between two profiles (43, 44). Covering profile (44) is medially fastened by means of horizontal arm (48) and cylinder flange (49) to the free end of double-action piston cylinder device (50), preferably a hydraulic or pneumatic contrivance. This permits the covering profile to be raised or lowered. Fixed at the upper side of horizontal arm (48) of covering profile (44) is guide profile (12), chamber (22) of which with its contact arrangement (20, 21) faces rim flange (19) (blade) of shroud (16). Guide profile (12) is covered by kicking strip (51) with a smooth surface matched to the opening of channel (42) in its dimensionalization. The stroke of piston-cylinder device (50) is such that in the raised position the opening of chamber (22) is medially positioned in front of rim flange (19) (blade), and in the lowered position the surface of kicking strip (51) closes flushly with the upper edge of channel (42), so that the latter is sealed. The electrically conductive connection in the closed position of shroud (16) shown in broken outline in FIG. 8 is established between shroud (16) and room shield (9) via contact springs (21), guide profile (12), covering profile (44), contact springs (47), and contact profile (43).

Illustrated in FIG. 6 is an embodiment form of the invention for a double-panel door, in which the reference numbers for the various parts agree with those for comparable parts in FIGS. 1-5. A special problem presented in this case is the shielding of fissure (53) between the two wings of the door. This double-panel door has standing wing (4) and transit wing (5). In the area of angled holder (17) near fissure (53), sheet-metal shroud (16) has extension (16*a*). At right-angled end (16*b*) of this extension (16*a*) is guide profile (12) with chamber (22) containing the contact arrangement (20). The width of extension (16*a*) is such that chamber (22) is medially positioned over rim flange (19) of shroud (16) of transit wing (5) when both door wings are closed. In addition, locking device (34) is located in this case between the standing and the transit wings in such a way that security bolt (35) is on the transit wing and receiver holes (36) are in the standing wing. Also mounted in the standing wing is slide bolt (33), by means of which the standing wing can be secured to both the door frame and the threshold base.

FIG. 7 depicts an alternative embodiment form of the invention for greater shielding security, which differs from the embodiment form shown in FIG. 1-4, in that two parallel chambers (22, 22*a*) with contact arrangements (20) are provided in guide profile (12). Accordingly, sheet-metal shroud (16) has two parallel rim flanges (19, 19*a*), while second rim flange (19*a*) is formed as a separate angled profile welded to the shroud. Otherwise, identical parts bear the same reference numbers as in FIGS. 1-4.

The functioning of the doors of the invention is explained below.

First, the functioning of the single-panel door will be described.

Door panel (1) is closed and held closed with the help of auxiliary holding and closing device (37). If the door is then to be shielded, the engagement of the shielding arrangement is triggered by means of an appropriately marked pressure switch. Such a pressure switch is located at both sides of each door of the invention. When the pressure switch is activated, the following sequential, pneumatic or hydraulic actions ensue automatically:

1. A terminal switch mounted in the door frame reports whether the door panel is in the proper closed position.
2. When the report of this terminal switch is positive, the door panel is locked by locking device (34).
3. Simultaneously and depending on the report of the terminal switch in the floor area, dirt-exclusion strip (38) is lowered, which can be accomplished by pneumatic or hydraulic cylinder (51).
4. After querying the pneumatic or hydraulic control as to whether functions 1 and 2 have been completed, piston-cylinder device (18) moves shroud (16) forward into its closed position, so that rim flange (19) (blade) glides into chamber (22) containing the springs. Shroud (16) is then in electrically conductive connection with room shield (9) and the door is shielded.
5. Additional provision can be made for visual display, by means of a luminance diode at the pressure switch, that the door is shielded.

The opening of the door involves the sequential steps described below.

A pressure switch marked "unshielding" is activated. Such a pressure switch is also located at both sides of each door. Activation of this pressure switch automatically triggers the following pneumatic or hydraulic actions:

1. Shroud (16) is withdrawn into the open position by piston-cylinder device (18), so that rim flange (19) disengages from chamber (22).
2. Once a terminal switch has reported that function 1 has been completed, the "shielding" signal at the pressure switch is extinguished to indicate that the shielding effect has been lifted.
3. Dirt-exclusion strip (38) in the floor area is raised and, at the same time, locking device (34) is withdrawn.
4. Once these steps have been completed, the door can be opened manually or by a motor drive. In order that the door can be opened in the event of failure of the hydraulic or pneumatic controls, recoil springs (52) are provided inside the cylinders of the piston cylinder device, whereby shroud (16) can be withdrawn. Locking device (34) also has recoil springs, so that the door can also be mechanically opened thereby at any time.

The closing and opening of the double-panel door shown in FIG. 2 are described below.

Closing the door:

1. Standing wing (4) is closed with the help of holding and closing device (37). A closing sequence regulator inside the standing wing ensures that the standing door is always closed first.
2. The standing wing is manually secured by means of a slide bolt or a rim bolt to the door frame at the top and the threshold base at the bottom. This can also be accomplished hydraulically or pneumatically.
3. In its closed state, the slide bolt activates a terminal switch, which reports to the pneumatic control that the protective device of the threshold base, i.e., the dirt-exclusion strip, can be lowered.
4. Once function 3 has been completed, this fact is reported by an appropriate terminal switch and the shroud is advanced by piston-cylinder device (18) into the closed position, so that rim flange (19) (blade) glides into chamber (22).
5. After completion of functions 1-4, transit wing (5) is closed. In order to make certain of this, a cylinder is provided above transit wing (5), which holds the said wing open until the pneumatic control has reported that functions 3 and 4 have been completed.
6. Once function 5 has been completed, which is reported via an appropriate terminal switch, the transit wing can be closed in the same manner as the single-panel door.

The opening of the double-panel door proceeds as follows:

1. A pressure switch marked "transit wing unshielding" is activated. Such a switch is provided at both sides of the door. When this pressure switch is activated, the transit wing is opened in the same manner as described for the single-panel door. It should be noted that the transit door must always be opened first. For this reason, the slide bolt is located in the fold of the middoor sleeve, so that it cannot be withdrawn until the transit door has been opened.
2. The standing wing is opened by first activating a pressure switch marked "standing wing unshielding." Such a pressure switch is provided only at the band side of the door. Activation of this pressure switch causes shroud (16) to move into its open position.
3. When an appropriate terminal switch has reported that the position described under function 2 has been assumed, the dirt-exclusion strip in the threshold slide bolt of the standing wing can then be, e.g., manually freed and the door wing can be opened.

The standing wing has no recoil springs, since, in case of a loss of pressure, there must be assurance that the shroud is displaced forward in order that the transit wing may be freely opened.

I claim:

1. High-frequency-impervious shielding door for shielding a room with an installed room shield, comprising at least one double-panel shrouded door and a door frame on which the door panels are hinged, as well as a contact arrangement for establishing an electrical connection, when the door is closed, between the shroud and the room shield terminating at the door frame, characterized by the fact that:

a sheet-metal shroud (16) paralleling said door panels, (1) is fixed displaceably between two end positions, wherein the end position remote from the door panel (1) is the closed position for contact arrangement (20) and the end position near door panels (1) is the open position for contact arrangement (20);

the contact arrangement (20) comprises at least one peripheral blade seal (19, 21) formed by several pairs of opposing springs (21) forming a contact fissure and at least one blade (19) which fits inside said contact fissure;

the blade (19) comprising a rim flange on the sheet-metal shroud;

the pairs of springs being affixed to door frame (2) by means of a guide profile (12); and the double-panel door comprising a standing panel (4) and a transit panel (5), and at least one additional pair of springs installed in a separating fissure (53) between the standing and transit panels and affixed to the standing panel.

2. Shielding door according to claim 1, characterized by the facts that threshold base (39) is arranged in the floor area of door frame (2), and that springs (21) making up the pairs of springs (21) are affixed to the top side of the threshold base facing toward the interior of room (7) by means of guide profile (12), while both ends of the threshold base are joined to room shield (9).

3. Shielding door according to claim 2, characterized by the fact that springs (21) making up the pairs of springs shielding the floor-door fissure and mounted on guide profile (12) can be lowered into the floor of the interior room to be shielded.

4. Shielding door according to claim 3, characterized by the fact that the guide profile (12) is elevatable and lowerable inside a floor channel (42) by means of piston-cylinder device (50).

5. Shielding door according to claim 4, characterized by the fact that guide profile (12) is affixed to horizontal arm (48) of U-shaped covering strip (45), downward directed arms (45) of which are designed as chambers (22) containing contact springs (47).

6. Shielding door according to claim 5, characterized by the fact that vertical arms (46) of U-shaped contact profile (43) connected to room shield (9) fit into arms (45).

7. Shielding door according to claim 2, characterized by the fact that the opening fissure of chamber (22) of guide profile (12) facing blade (19) can be closed by means of an elevatable and lowerable dirt-exclusion strip (38).

8. High-frequency-impervious shielding door for shielding a room with an installed room shield, comprising:

a shrouded door panel and a door frame on which the door panel is hinged;

a contact arrangement for establishing an electrical connection, when the door is closed, between the shroud and the room shield terminating at the door frame;

a sheet-metal shroud (16) paralleling the door panel (1) and displaceably fixed between two end positions relative to the door panel;

a contact arrangement (20) associated with the door frame in facing relation with the shroud (16); and means selectively operative independently of closure of the door to actively move the shroud (16) to a first end position relatively remote from the door panel in the closed position, so as to move the shroud into an electrically conductive connection with the contact arrangement in that first end position, or to a second end position relatively near the door panel so as to actively move the shroud away from said electrically conductive connection with the contact arrangement.

9. Shielding door according to claim 8, further comprising:

a blade seal movable with the shroud, the blade seal extending substantially perpendicular to the shroud and substantially parallel to the direction of displacement of the shroud with respect to the door panel; and wherein the contact arrangement comprises a spring means defining a fissure in confronting alignment with the blade seal, so that the blade seal enters the fissure in response to moving the shroud to the first end with the door panel in the closed position.

10. High-frequency-impervious shielding door for shielding a room with an installed room shield, comprising at least one shrouded door panel and a door frame on which the door panel is hinged, as well as a contact arrangement for establishing an electrical connection, when the door is closed, between the shroud and the room shield terminating at the door frame, characterized by the fact that:

a sheet-metal shroud (16) paralleling said door panel (1) is fixed displaceably between two end positions, wherein the end position remote from the door panel (1) is the closed position for contact arrangement (20) and the end position near door panel (1) is the open position for contact arrangement (20);

the contact arrangement (20) comprises at least one peripheral blade seal (19, 21) formed by several pairs of opposing springs (21) forming a contact fissure and at least one blade (19) which fits inside said contact fissure; and the sheet-metal shroud (16) is selectively displaceable by active piston-cylinder devices (18) mounted on the door panel (1).

11. Shielding door according to claim 10, characterized by the fact that blade (19) is designed as a rim flange on the sheet-metal shroud.

12. Shielding door according to claim 11, characterized by the fact that the rim flange is formed as a one-piece, right angled elbow of shroud (16).

13. Shielding door according to claim 11 or 12 characterized by the fact that the pairs of springs are affixed to door frame (2) by means of guide profile (12).

14. Shielding door according to claim 2 characterized by the fact that springs (21) making up the pairs of contact springs and guide profile (12) are covered by a covering and security profile (27) joined to door frame (2).

15. Shielding door according to claim 14 characterized by the fact that auxiliary holding and closing device (37) is fixed to door panel (1).

16. Shielding door according to claim 15 characterized by the fact that locking device (34) is provided in door panel (1), which engages in holes (36) in door frame (1).

17. Shielding door according to claim 16, characterized by the fact that the door is a double-panel door, and by a slide bar (33) provided in a standing wing (4) of the double-panel door and operative to secure the wing at the top and the bottom.

18. Shielding door according to claim 17, characterized by the fact that the slide bar is located in the fold of the middoor sleeve.

* * * * *